United States Patent
Lee et al.

(10) Patent No.: US 6,689,696 B2
(45) Date of Patent: Feb. 10, 2004

(54) METHOD FOR MANUFACTURING SEMICONDUCTOR DEVICE EMPLOYING DIELECTRIC LAYER USED TO FORM CONDUCTIVE LAYER INTO THREE DIMENSIONAL SHAPE

(75) Inventors: Joo-won Lee, Suwon (KR); Ki-yeon Park, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 80 days.

(21) Appl. No.: 09/939,723

(22) Filed: Aug. 28, 2001

(65) Prior Publication Data

US 2002/0052112 A1 May 2, 2002

(30) Foreign Application Priority Data

Aug. 29, 2000 (KR) .......................................... 2000-50356
Jun. 1, 2001 (KR) .......................................... 2001-30774

(51) Int. Cl.$^7$ ............................................. H01L 21/311
(52) U.S. Cl. ....................................... 438/702; 438/723
(58) Field of Search ................................ 438/704, 702, 438/706, 723, 724, 745

(56) References Cited

U.S. PATENT DOCUMENTS

| | | | | |
|---|---|---|---|---|
| 4,992,306 A | * | 2/1991 | Hochberg et al. | 427/255.29 |
| 5,269,880 A | * | 12/1993 | Jolly et al. | 438/701 |
| 5,390,072 A | * | 2/1995 | Anderson et al. | 361/313 |
| 5,858,824 A | * | 1/1999 | Saitoh | 438/167 |
| 5,862,057 A | * | 1/1999 | Xia et al. | 716/21 |
| 6,211,092 B1 | * | 4/2001 | Tang et al. | 438/719 |
| 6,265,288 B1 | * | 7/2001 | Okamoto et al. | 438/485 |
| 6,277,757 B1 | * | 8/2001 | Lin | 438/704 |
| 6,399,511 B2 | * | 6/2002 | Tang et al. | 438/714 |

* cited by examiner

*Primary Examiner*—Kin-Chan Chen
(74) *Attorney, Agent, or Firm*—Volentine Francos, PLLC

(57) ABSTRACT

A method for manufacturing a semiconductor device employing a dielectric layer for forming a conductive layer into a three-dimensional shape. The dielectric layer is formed on a substrate in such a manner as to provide an intrinsic etch rate within the layer which increases in the direction of the thickness or depth of the dielectric layer. This variable intrinsic etch rate within the dielectric layer is achieved by changing one of a plurality of deposition variables. Once formed, the dielectric layer is selectively etched to form a through hole to contact a conductive area underlying the dielectric layer. A conductive layer is formed in the through hole, which may be a storage node of a capacitor.

4 Claims, 10 Drawing Sheets

METHOD FOR MANUFACTURING SEMICONDUCTOR DEVICE EMPLOYING DIELECTRIC LAYER USED TO FORM CONDUCTIVE LAYER INTO THREE DIMENSIONAL SHAPE

BACKGROUND OF THE INVENTION

1. Field of the Invention

The present invention relates to a method for manufacturing a semiconductor device, and more particularly, to a method for manufacturing a conductive layer having a three-dimensional shape, such as a storage node of a capacitor, using a dielectric layer as a mold.

2. Description of the Related Art

The elements of a semiconductor device are becoming more densely integrated to improve the processing speed and increase the memory capacity of the resulting devices. Manufacturing processes for 16M and 64M dynamic random access memory (DRAM) devices are being replaced by 256M manufacturing processes, and mass production techniques for 1G devices are rapidly evolving. As the design rules for semiconductor devices decrease, the area occupied by memory elements (e.g., a capacitor) need to be decreased. However, it becomes difficult to provide such a capacitor to meet the design requirement, and yet still obtain sufficient capacitance to properly operate within the DRAM device.

To overcome the difficulties in forming such a capacitor, methods for increasing the effective surface area of a dielectric layer have been introduced, for example, forming three-dimensional capacitor structures, such as a stack type capacitor, a trench type capacitor, or a cylinder type capacitor.

In particular, a method for forming a three-dimensional storage node using a mold has been suggested. In order to increase the surface area of a three-dimensional capacitor occupying only a limited space due to a decreased and restricted cell area, the height of the three-dimensional storage node must be increased. However, increasing the height of a capacitor causes difficulties in performing an etching process for forming a three-dimensional capacitor, in particular, an etching process for patterning a mold.

FIG. 1 is a vertical scanning electron microscope (SEM) image of a mold patterned for forming a three-dimensional storage node. FIG. 2 is a vertical SEM image of a capacitor including a three-dimensional storage node formed using the mold shown in FIG. 1. FIG. 3 is a vertical SEM image of the bottom portions of a three-dimensional storage node which illustrates certain problems with a capacitor including the three-dimensional storage node. FIG. 4 is a graph showing the deterioration of leakage current characteristics of a capacitor including a three-dimensional storage node.

Referring to FIG. 1, a conventional method for forming a semiconductor device including a storage node of a capacitor includes a step of forming a layer of silicon oxide on a semiconductor substrate, with the silicon oxide layer being used later as a mold layer. Then mold layer is then etched to form a through hole exposing a lower contact, such as a buried contact (BC) or other structure. The mold layer may generally be thick, usually with a thickness of between several thousands of angstroms to 10000 Å. The reason the mold layer is so thick is that the height of a storage node or capacitor to be formed later is dependent on the thickness of this mold layer.

However, since the mold layer is relatively thick, it is difficult to obtain a good sidewall profile of the through hole, which is formed by selectively etching the mold layer. As shown in FIG. 1, it is hard to obtain a sufficient critical dimension (CD) at the bottom portion of the through hole exposing the buried contact. Note that the top CD of the through hole is greater than the bottom CD of the through hole, and thus the through hole has an inclined sidewall. With the typical processes for etching a thick mold layer, it is hard to obtain a sufficient bottom CD of the through hole because it is difficult to obtain a through hole having a sidewall that is perpendicular to the bottom of the through hole.

Referring to FIG. 2, after forming the mold having the through hole, in subsequent process steps a storage node layer is deposited on the mold and along the sidewalls and bottom of the through hole. Since the deposited storage node layer conforms to the shape of the mold, a storage node can be formed into a three-dimensional structure (e.g., a cylinder type or stack type structure) by patterning or separating the storage node layer to achieve the requisite shaped through hole. The mold is removed using the storage node as a mask, and then a dielectric layer and a plate node are formed on the storage node, thereby forming a capacitor.

It is evident that the shape of the capacitor described above depends on the shape of the storage node. More specifically, the shape of the storage node substantially depends on the shape or profile of the through hole (or the mold). As described above, if the bottom CD of the through hole of the mold is smaller than the top CD of the through hole, i.e., if the sidewall of the through hole (or the mold) is inclined, the resulting storage node that is formed is also inclined, and thus the bottom CD of the capacitor is inevitably narrower than the top CD of the capacitor, as is illustrated in FIG. 2.

When the bottom CD of the capacitor is narrower than the top CD of the capacitor, the capacitor or storage node is structurally unstable, and thus the storage node or capacitor may tilt to one side or collapse. In addition, when the bottom CD of the capacitor is narrower than the top CD of the capacitor, the aspect ratio of a gap between adjacent storage nodes is deteriorated. Accordingly, the step coverage of the dielectric layer or the plate node may deteriorate at the bottom of the gap between adjacent storage nodes, and thus the electrical characteristics of the whole capacitor may deteriorate.

FIG. 3 shows a deteriorated aspect ratio of the gap 60 between storage nodes whose bottom CDs are narrower than the top CDs. In other words, the opening of the gap between the storage nodes is narrower than the bottom portion of the gap between the storage nodes. As a result, the step coverage of the dielectric layer or plate node may be deteriorated.

FIG. 4 shows that if the step coverage of the dielectric layer or plate node is deteriorated, the electrical characteristics of a capacitor, such as leakage current characteristics, are deteriorated (essentially an increase in leakage current is experienced).

Also, if the sidewalls of a three-dimensional storage node are inclined, i.e., if the bottom CD of the storage node is narrower than the top CD of the storage node, the misalignment margins between the storage node and a lower buried contact become narrower. Accordingly, resistance may increase due to the decrease of the contact area between the lower part of the storage node and the buried contact.

SUMMARY OF THE INVENTION

To solve the above-described problems, it is an object of the present invention to provide a method for manufacturing a semiconductor device, which is capable of preventing the sidewalls of three-dimensional storage nodes from being inclined due to the inclined sidewalls of a dielectric layer used as a mold for forming such storage nodes.

Accordingly, to achieve the above object, there is provided a method for manufacturing a semiconductor device according to an aspect of the present invention. The method includes forming a dielectric layer on a substrate, with the dielectric layer having an intrinsic etch rate which increases with the depth (or thickness) of the dielectric layer. This variable intrinsic etch rate is achieved by changing one of a plurality of deposition variables. The dielectric layer is selectively etched in order to form a through hole that passes through the dielectric layer. A conductive layer, i.e., a storage node of a capacitor, is then formed in the through hole.

In selectively etching the dielectric layer, as the depth to which the dielectric layer is etched increases, the etch rate of the dielectric layer increases. The etch rate of the lowest or bottom portion of the dielectric layer may be 1.1–10 times greater than the etch rate of the highest or top portion of the dielectric layer.

The dielectric layer may be formed of silicon oxide deposited by a chemical vapor deposition (CVD)-based method. With regard to the deposition parameters that may be varied, during the CVD method, the plasma power of the chemical vapor deposition may be gradually increased, and the deposition temperature of the chemical vapor deposition may be gradually increased. The content of a silicon source of the chemical vapor deposition, which is used to form silicon oxide, may be gradually decreased relative to an oxidation source, which oxidation source is also used to form silicon oxide in combination with the silicon source. The pressure within the deposition chamber used in the chemical vapor deposition process may be gradually decreased. Also, the gap between a shower head for supplying a source required for a deposition reaction and the semiconductor substrate of the chemical vapor deposition may be gradually decreased.

The chemical vapor deposition may be thermal chemical vapor deposition or plasma-enhanced chemical vapor deposition.

The dielectric layer (or mold layer) may be formed of a borophosphosilicate glass (BPSG) layer or a phosphosilicate glass (PSG) layer having a doping concentration which gradually varies along the direction of the depth or thickness of the dielectric layer. For example, the dielectric layer may be formed so that the doping concentration increases gradually from the top portion of the dielectric layer to the bottom of the dielectric layer.

The bottom critical dimension (CD) of the through hole may be substantially equal to the top CD of the dielectric layer. Alternatively, the bottom CD of the through hole may be substantially greater than the top CD of the through hole. In either case, the resulting storage node is structurally stable.

The dielectric layer may be selectively etched by a wet etching-based etching method or a dry (anisotropic) etching-based etching method.

According to the embodiment of the present invention, it is possible to prevent the sidewalls of three-dimensional storage nodes from being inclined due to the inclined sidewalls of a mold introduced for forming such storage nodes.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 1:
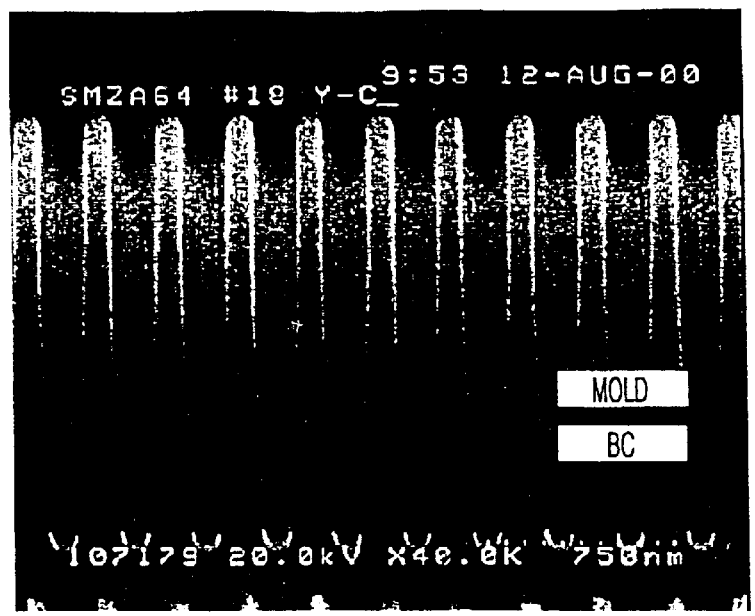
FIGS. 1 through 3 are vertical scanning electron microscope (SEM) images illustrating a conventional method for manufacturing a semiconductor device including a storage node of a capacitor.
Figure 2:
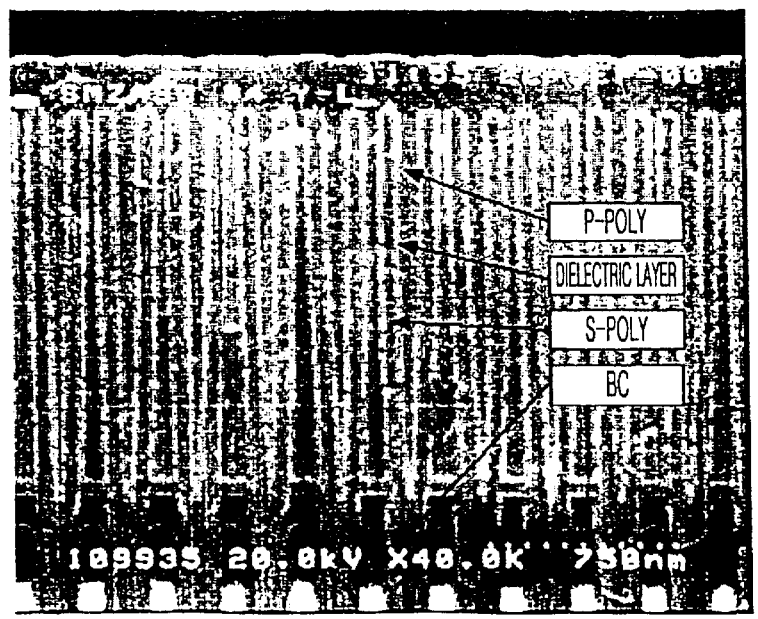
Figure 3:
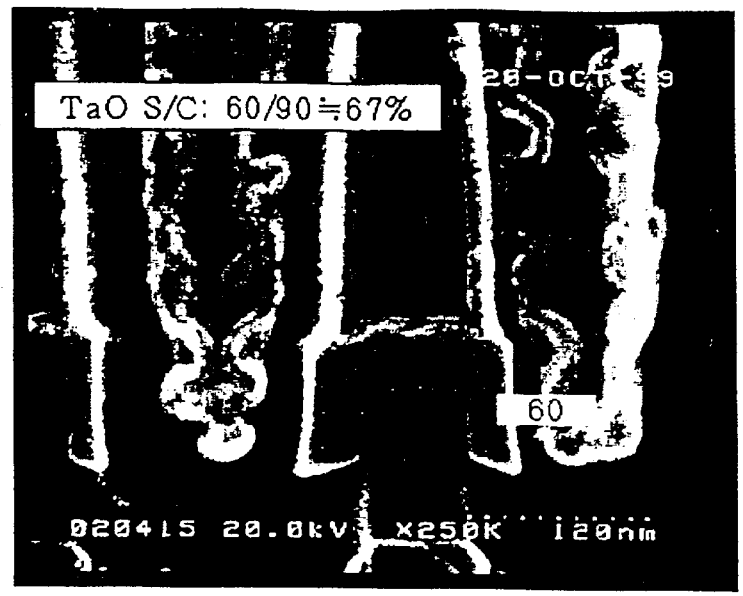
Figure 4:
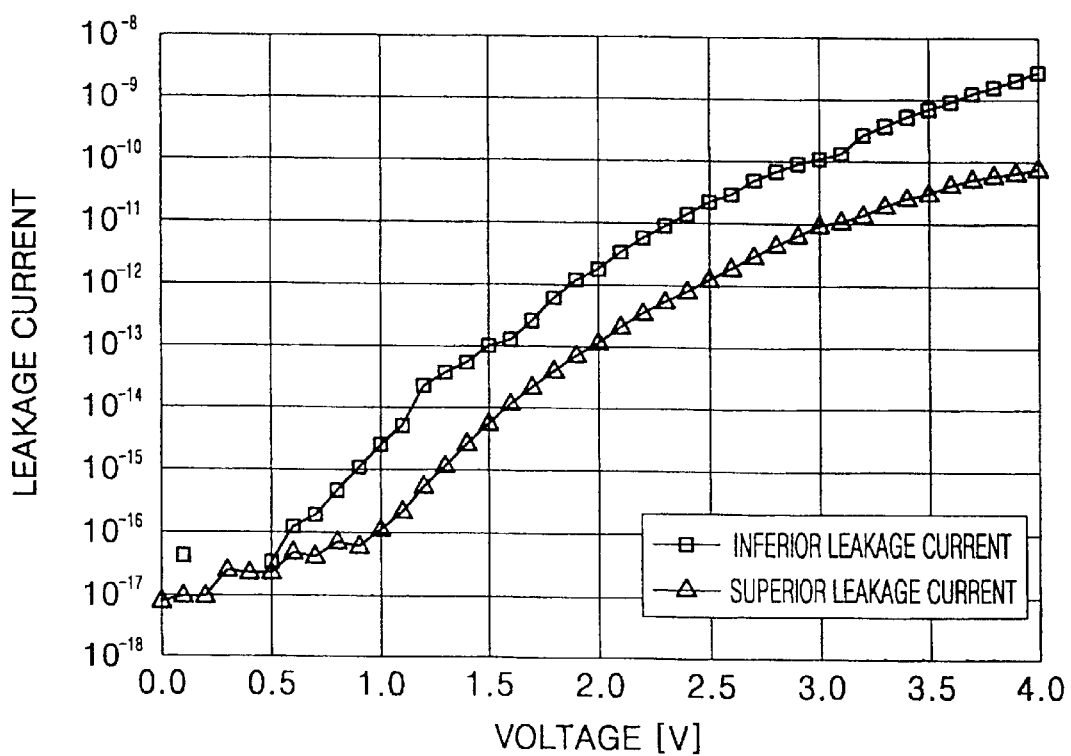
FIG. 4 is a graph showing the deterioration of leakage current characteristics of a capacitor including a three-dimensional storage node.

The present invention will now be described more fully with reference to the accompanying drawings, in which a preferred embodiment of the invention is shown. This invention may, however, be embodied in many different forms and should not be construed as being limited to the embodiments set forth herein. Rather, the embodiments are provided so that this disclosure will be thorough and complete, and will fully convey the concept of the invention to those skilled in the art. In the drawings, the thickness of a layer or region are exaggerated for clarity. It will also be understood that when a layer is referred to as being "on" another layer or substrate, it can be directly on the other layer or substrate, or intervening layers may also be present.

In broadest terms, in the embodiment of the present invention, a method for forming a mold including a through hole with a substantially perpendicular sidewall profile is described. The mold including the though hole is formed as a preliminary step during the formation of a storage node. The method prevents the three-dimensional storage node from having an inclined sidewall by inducing the sidewall of the storage node to be substantially perpendicular. In order to make the sidewall profile of the through hole substantially perpendicular, a method for forming a mold layer by gradually depositing a material having a gradually-decreasing intrinsic etch rate is described. Therefore, according to the present inventive method, an upper portion of the mold layer will exhibit a lower intrinsic etch rate compared to a lower portion of the mold layer. The intrinsic etch rate, as described and employed in the embodiment of the present invention, indicates the etch rate of a material which is independent of the surroundings, for example, an independent monolayer with a uniform and homogenous state.

FIGS. 5 through 16 are diagrams illustrating a method for manufacturing a semiconductor device including a storage node of a capacitor according to an embodiment of the present invention.

Figure 5:
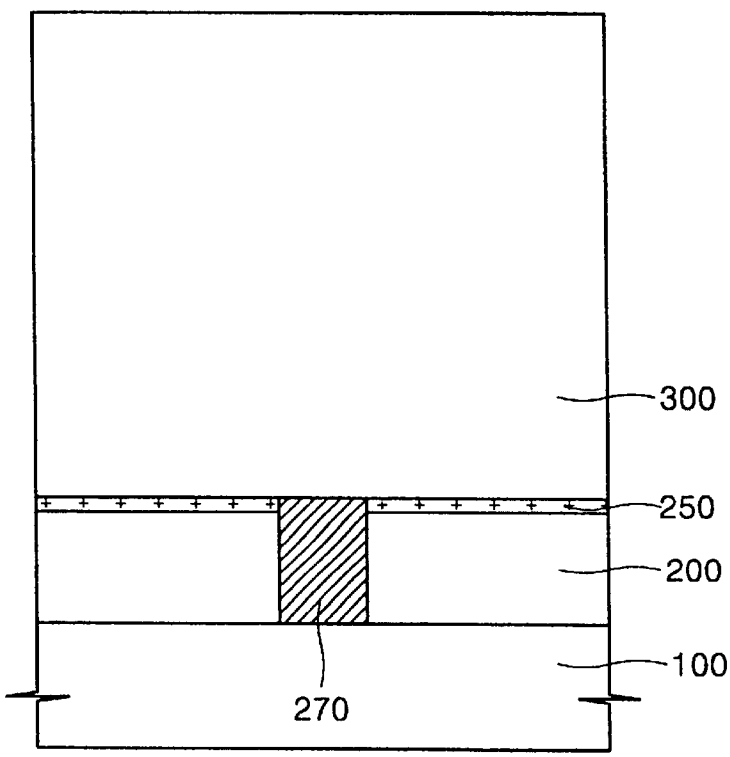
FIG. 5 is a cross-sectional view illustrating a step of forming a mold layer on a semiconductor substrate according to an embodiment of the present invention.

FIG. 5 is a cross-sectional view illustrating a step of forming a mold layer 300 on a semiconductor substrate 100. Specifically, a buried contact (BC) type contact 270 is formed through a lower dielectric layer 200 so as to be electrically connected to an active region of the semiconductor substrate 100. To form the BC, an etching stopper 250 is first formed on the lower dielectric layer 200. The lower dielectric layer 200 is formed of silicon oxide and a contact hole is then formed through the lower dielectric layer 200. The contact hole is filled to form contact 270. The contact 270 may be formed of various conductive materials, such as conductive polycrystalline silicon. The etching stopper 250 is preferably formed of a dielectric material, such as silicon nitride, having an etching selectivity with respect to a subsequently formed dielectric layer (i.e., mold layer 300).

The mold layer 300 is formed to cover the contact 270 formed in the lower dielectric layer 200 and the etching stopper 250. The mold layer 300 may be formed as a sacrificial layer which is later used to form a storage node of a capacitor. Even though the mold layer 300 is formed as a sacrificial layer, the mold layer 300 may be formed of an dielectric material having an etching selectivity with respect to the etching stopper 250 formed of silicon nitride. In this case, since the mold layer 300 is a sacrificial layer used to form a storage node of a capacitor, the mold layer 300 is preferably formed to a thickness substantially equivalent to the height of the desired storage node. The mold layer 300 may be formed to a thickness of between several thousands angstroms and several tens of thousands angstroms, for example, 14,000 Å.

The mold layer 300 is formed such that the intrinsic etch rate of the mold layer 300 is continuously or gradually varied along the direction of the depth or thickness of the mold layer 300. As used herein, the intrinsic etch rate describes the experimental etch rate of a portion of the mold layer 300, which is independent of the other portions of the mold layer 300, and depends on only the material properties of the portion of the mold layer 300 to be measured. The intrinsic etch rate does not indicate the etch rate of the mold layer 300 as a whole in patterning the mold layer 300, but rather the experimental etch rate of each portion of the mold layer 300 when the mold layer 300 is treated as a plurality of independent and uniform monolayers.

The mold layer 300 is deposited so that an upper portion of the mold layer 300 has an etch rate that is lower relative to that of a lower portion of the mold layer 300, and the upper and lower portions of the mold layer are treated as separate and uniform layers. In other words, the mold layer 300 is formed by gradually depositing a material in which the intrinsic etch rate gradually varies. Namely, a dielectric layer used as the mold layer 300 is deposited while changing one or more deposition parameters such that the mold layer 300 has an intrinsic etch rate that varies along its depth or thickness direction.

The mold layer 300 may be formed by a chemical vapor deposition (CVD)-based deposition method, such as a thermal CVD method or a plasma-enhanced chemical vapor deposition (PE CVD) method, for example, a plasma-enhanced tetraethylorthosilicate (PE TEOS) deposition.

The CVD-based deposition method is advantageous since it facilitates the technique of changing process variables during the deposition of the mold layer 300, and thus making the characteristics of the mold layer 300 vary continuously in the direction of the thickness of the mold layer 300. By way of example and not limitation, in the embodiment of the present invention, a method of depositing the mold layer 300 using a PE CVD apparatus will be described in detail.

Figure 6:
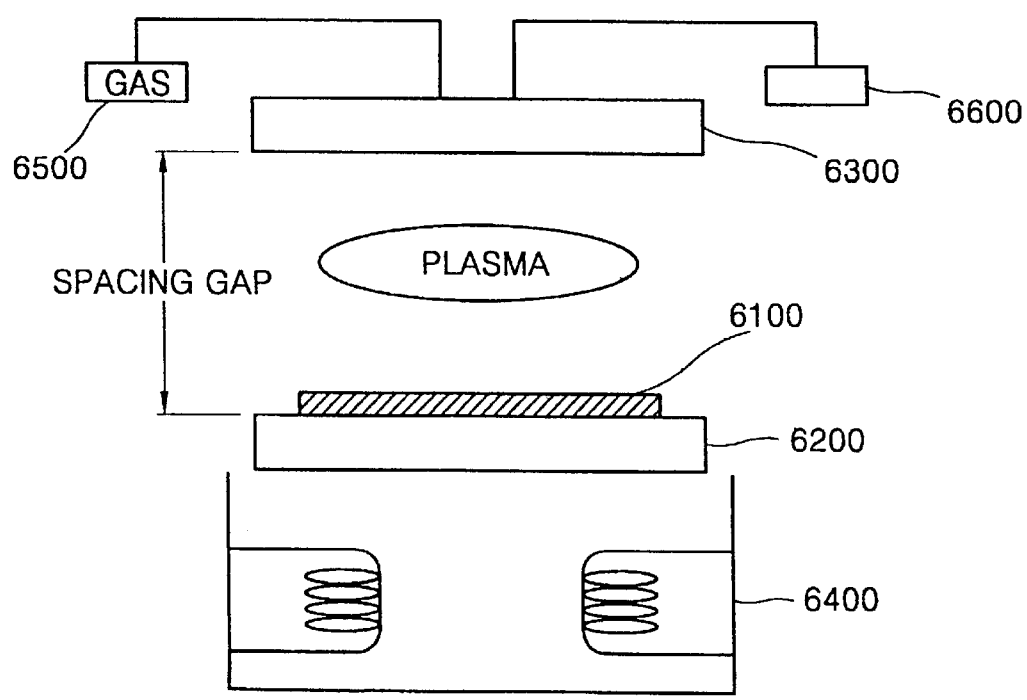
FIG. 6 is a schematic view illustrating a plasma enhanced chemical vapor deposition apparatus which can be used for forming the mold layer embodiment of the present invention.

FIG. 6 is a schematic view illustrating a PE CVD apparatus which can be used for forming the mold layer 300 of the present invention. PE CVD is type of chemical vapor deposition method, which is known to enhance the deposition characteristics of a material using plasma. The PE CVD apparatus includes a susceptor 6200 in a lower portion of the chamber on which a wafer 6100 is placed, a shower head 6300 positioned above the wafer 6100, and a heater 6400 such as a heating lamp positioned below the susceptor 6200. These basic elements are all installed in one chamber. A gas supply source 6500 is connected to the shower head 6300, so that a reaction gas can be supplied to the shower head 6300. A power supply 6600 is connected to the shower head 6300 so that the RF power required for generating a plasma can be applied to the shower head 6300.

For the case of depositing the mold layer 300 of FIG. 5 using such a PE CVD apparatus, the pressure and temperature of the chamber, the RF power for generating the plasma, the ratio between reaction gases, the flow rates of reaction gases, and a spacing gap (see FIG. 6) between the shower head 6300 and the wafer 6100, are considered deposition conditions or parameters. During deposition of the mold layer 300, one or more of these deposition conditions are continuously or gradually changed so that the intrinsic etch rate of the mold layer 300 is induced to continuously or gradually vary along the direction of the thickness of the mold layer 300.

Figure 7:
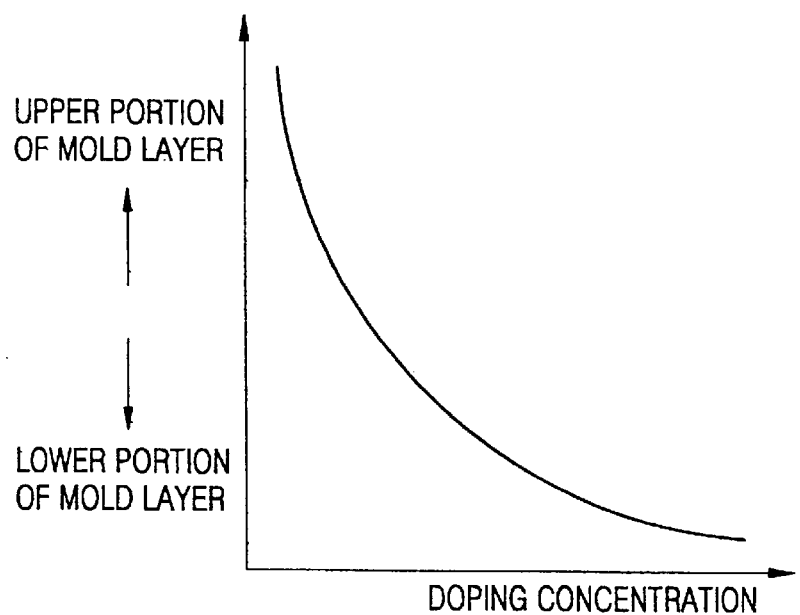
FIG. 7 is a graph showing the doping concentration profile of a mold layer along the direction of the depth or thickness of the mold layer.

Referring again to FIG. 5, in order to induce the intrinsic etch rate of the mold layer 300 to vary along the direction of the thickness of the mold layer 300, the mold layer 300 may be formed of a borophosphosilicate glass (BPSG) layer or a phosphosilicate glass (PSG) layer. The intrinsic etch rate of each portion of the mold layer 300 may be varied along the direction of the thickness of the mold layer 300 by continuously decreasing the concentration of dopants doped while depositing the BPSG or PSG layer. In other words, at an early stage of depositing the BPSG or PSG layer, the dopants have a relatively high doping concentration and the longer the deposition process is performed, the lower the dopant concentration becomes. The doping concentration profile of the mold layer 300 is shown in FIG. 7. The BPSG or PSG layer deposited with a high doping concentration exhibits a higher intrinsic etch rate compared to the BPSG or PSG layer deposited with a lower doping concentration. Therefore, if the mold layer 300 is formed by depositing the BPSG or PSG layer with such a doping concentration profile, the intrinsic etch rate of each portion of the mold layer 300 is varied along the direction of the thickness of the mold layer 300.

Figure 8:
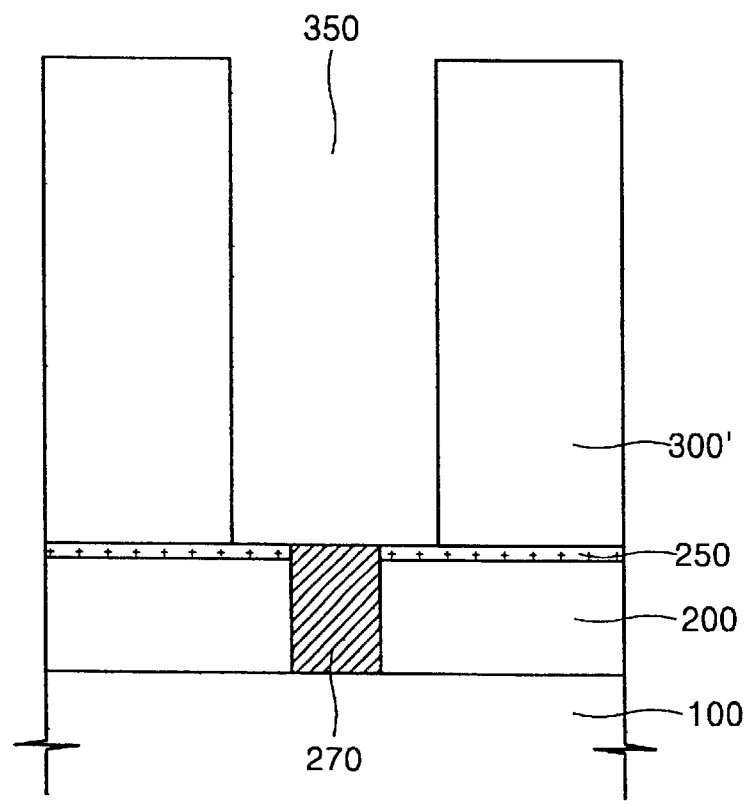
FIG. 8 is a cross-sectional view illustrating a step of forming a mold according to an embodiment of the present invention.

FIG. 8 is a cross-sectional view illustrating a step of forming a mold 300' including a through hole 350 exposing the contact 270 by selectively etching the mold layer 300 using photolithography. As described with reference to FIG. 5, the intrinsic etch rate of each portion of the mold layer 300 varies along the direction of the thickness of the mold layer 300. Note the intrinsic etch rate of the lower portion of the mold layer 300 of FIG. 5 is higher than the intrinsic etch rate of the upper portion of the mold layer 300 of FIG. 5. Thus, it is possible to compensate for, or overcome, the gradually decreasing etch rate along the depth direction of a through hole during the entire etching process for forming the through hole 350. During the etching process for forming the through hole 350, as the through hole 350 becomes deeper, the intrinsic etch rate of the mold layer 300 subjected to the etching process increases.

As described above, if the mold layer had been a conventional monolayer exhibiting uniform and homogeneous characteristics throughout, and an etching process for forming a through hole was performed on the conventional mold layer, the etch rate of the mold layer may become lower during the etching process for forming the through hole, or the through hole may be inclined due to the influence of structural factors of the through hole. In other words, the etching of the mold layer may be gradually hindered due to the influence of polymers or by-products produced during the formation of the through hole, and thus the walls of the through hole may become slanted or inclined.

However, in the embodiment of the present invention, since the mold layer 300 is formed such that the intrinsic etch rate of each portion of the mold layer 300 of FIG. 5 varies along the thickness direction of the mold layer 300 of FIG. 5, the etching of the mold layer 300 is not hindered and thus the walls of the through hole 350 can be prevented from being slanted. This is because as the etching process reaches a deeper portion of the mold layer 300, the intrinsic etch rate is higher, which enhances rather than hinders, the etching of the mold layer 300. Accordingly, the through hole 350 can have a substantially straight and perpendicular sidewall.

Moreover, in an alternative embodiment, since the deeper (or lower) portion of the mold layer 300 of FIG. 5 exhibits a higher etch rate, and as the etching process for forming the mold 300' by etching the mold layer 300 to form the through hole 350 reaches a deeper portion of the mold layer 300, the etch rate of the mold layer 300 in the etching process can be gradually increased. As a result, the through hole 350 may be formed such that its bottom CD is greater than its top CD.

The mold layer 300 may be dry (anisotropic) or wet etched using typical etching conditions applied to the silicon oxide comprising the mold layer 300. However, the mold layer 300 is preferably etched by wet etching, which is more advantageous in making the sidewall profile of the through hole 350 substantially perpendicular, and thereby making the bottom CD of the through hole 350 be at least equal to the top CD of the through hole 350.

The fact that the through hole 350 has a substantially perpendicular sidewall profile is mainly caused by the structural membranous characteristics of the mold layer 300 of FIG. 5 achieved during the deposition, not by the characteristics of the etching process for forming the mold 300'. In other words, the vertical variation of the membranous characteristics of the mold layer 300 of FIG. 5 is dependent on the deposition conditions of the mold layer 300, and thus the variation of the intrinsic etch rate of the mold layer 300 is substantially dependent on the deposition conditions of the mold layer 300 of FIG. 5. The effect on the intrinsic etch rate of changing the deposition conditions for the mold layer 300 can be understood through the graphs shown in FIGS. 9 through 13.

Figure 9:
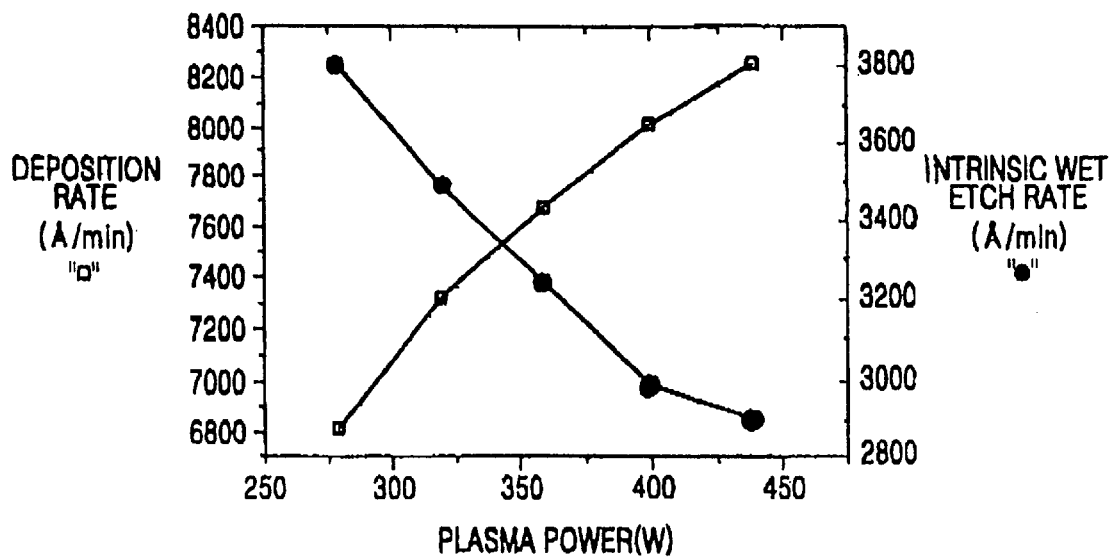
FIGS. 9 through 13 are graphs showing the variation of an intrinsic wet etch rate with respect to various deposition conditions while depositing a mold layer according to an embodiment of the present invention.
Figure 10:
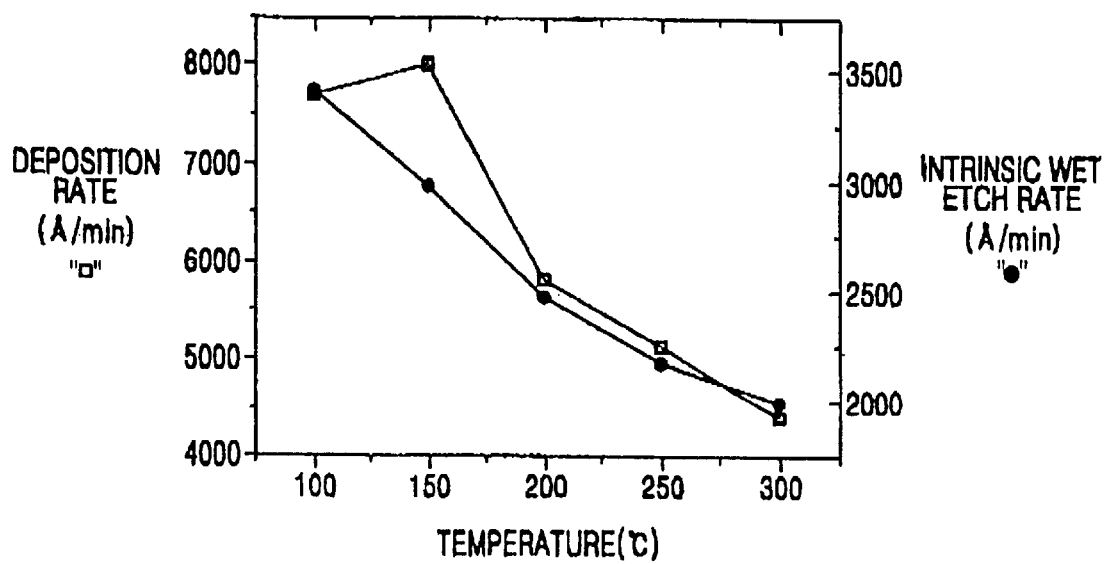
Figure 11:
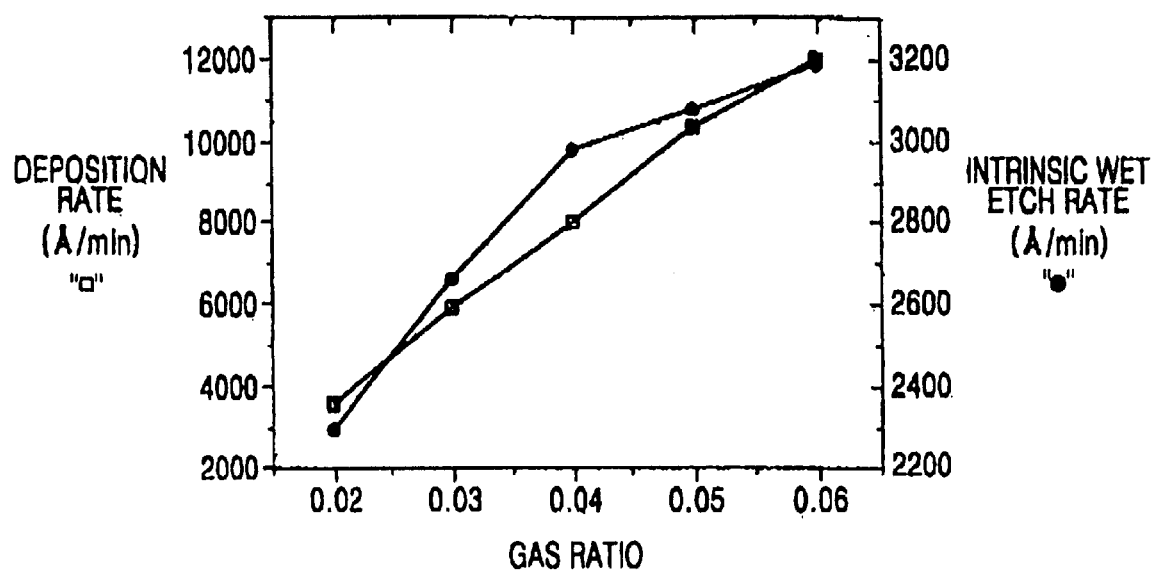
Figure 12:
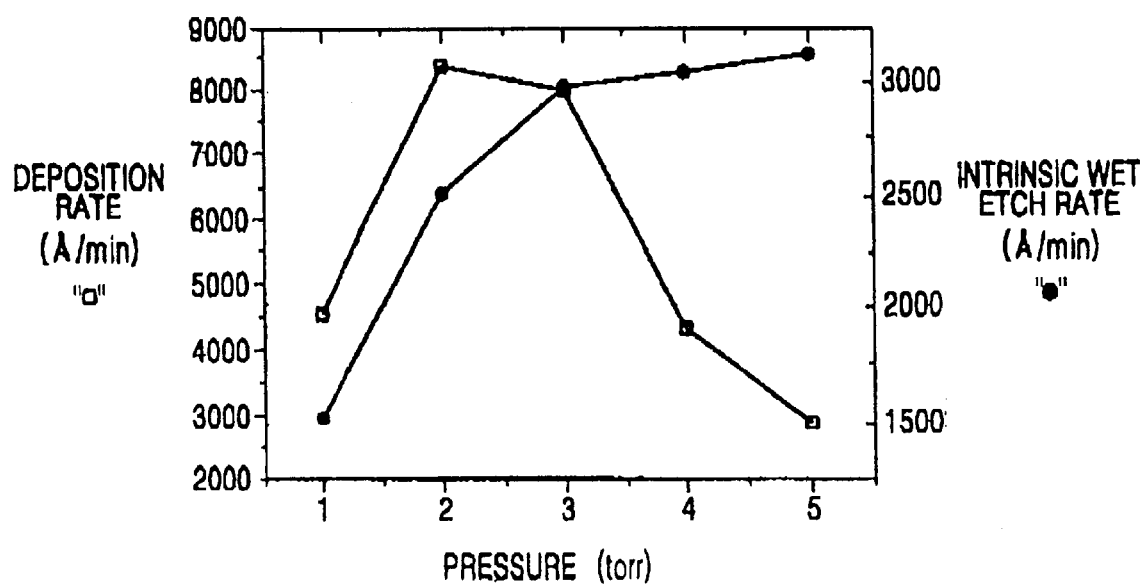
Figure 13:
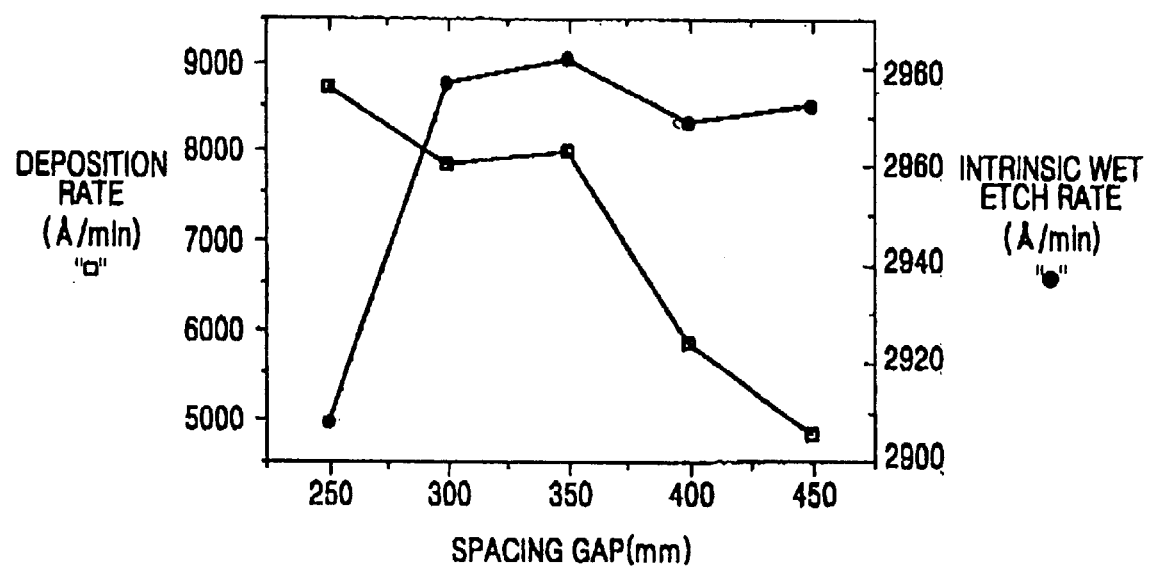

FIG. 9 is a graph showing the variation of a deposition rate and an intrinsic wet etch rate with respect to the variation of the plasma power of a deposition apparatus while depositing a dielectric layer to be used as the mold layer 300. FIG. 10 is a graph showing the variation of a deposition rate and an intrinsic wet etch rate with respect to the variation of deposition temperature. FIG. 11 is a graph showing the variation of a deposition rate and an intrinsic wet etch rate with respect to the variation of a ratio of reaction gases used in depositing a dielectric layer to be used as the mold layer 300. FIG. 12 is a graph showing the variation of a deposition rate and an intrinsic wet etch rate with respect to the variation of chamber pressure. FIG. 13 is a graph showing the variation of a deposition rate and an intrinsic wet etch rate with respect to the variation of a spacing gap between a shower head and a semiconductor substrate while depositing a dielectric layer to be used as the mold layer 300.

The results illustrated in FIGS. 9 through 13 were obtained from the deposition of different dielectric layers which were used as the mold layer 300, with each of the dielectric layers being deposited under substantially the same deposition conditions.

During each of the deposition sequences, the base deposition parameters were as follows: (i) $SiH_4$ gas (used as a silicon source) having a flow rate of 115 sccm, (ii) $N_2O$ gas (used as an oxidation source) having a flow rate of 1,700 sccm, (iii) temperature of 400° C., (iv) chamber pressure of 2.2 torr, (v) a plasma power of 295 W, and (vi) a shower head and susceptor gap of 535 mils. Each of the depositions was performed with all of these base conditions, except that one of the conditions was varied. In other words, all the above deposition conditions except for one of the base deposition conditions were directly applied to the formation of each dielectric layer, and the results are illustrated in FIGS. 9 through 13.

Further, the dielectric layer, i.e., the mold layer 300, was deposited in a DXZ type chamber of the P-5000 model available from Applied Materials, Inc. of Santa Clara, Calif. The wet etch rate of the dielectric layer (the mold layer 300) was measured based on the amount by which silicon oxide of the dielectric layer was etched after treating the dielectric layer in a solution having a $NH_4OH$:HF:deionized water ratio of 19:1:80 at room temperature for 10 minutes. The dielectric layer was then treated in a solution having a $NH_4OH$:HF:deionized water ratio of 1:4:20 at a temperature of 70° C. for 10 minutes.

In FIGS. 9 through 13, the lines indicated by the square symbol "□" show the deposition rate (Å/min) of the dielectric layer to be used as the mold layer 300, and the lines indicated by the circle symbol "●" show the intrinsic etch rate (Å/min) of the dielectric layer to be used as the mold layer 300. The results of measuring the etch rate of each dielectric layer dealt with in the graphs of FIGS. 9 through 13 were the same as the results of measuring monolayers formed under the deposition conditions described above.

Referring to FIG. 9, while depositing a dielectric layer to be used as the mold layer 300, the intrinsic wet etch rate of the mold layer 300 was varied by changing the plasma power. Table 1 shows the results of depositing the dielectric layer in a plurality of steps while varying the plasma power.

TABLE 1

Deposition of Dielectric Layer While Varying Plasma Power

| Deposition Step | Plasma Power (W) | Deposition Time (sec) | Target Thickness (Å) |
|---|---|---|---|
| 1 | 95 | 10 | 1,000 |
| 2 | 126 | 9.2 | 1,000 |
| 3 | 156 | 8.4 | 1,000 |
| 4 | 187 | 7.5 | 1,000 |
| 5 | 217 | 6.5 | 1,000 |
| 6 | 248 | 5.5 | 1,000 |
| 7 | 279 | 4.5 | 1,000 |
| 8 | 295 | 50 | 7,000 |
| Final Target | | | 14,000 |

As shown in Table 1 and FIG. 9, as the plasma power increases, the deposition rate of silicon oxide comprising the dielectric layer increases, and the intrinsic wet etch rate of the dielectric layer also decreases. Therefore, during an etching process for etching the mold layer 300 to form the through hole 350, it is possible to prevent the etch rate of the mold layer 300 from being gradually hindered by depositing the dielectric layer with a relatively low plasma power at first, and then gradually or continuously increasing the plasma power. This prevents the prior art problem where the etch rate of the mold layer 300 gradually decreases as the etching process for etching the mold layer 300 progresses. As a result, the sidewall profile of the through hole 350 can be substantially perpendicular, or the bottom CD of the through hole 350 can be slightly greater than the top CD of the through hole 350.

Referring to FIG. 10, when depositing a dielectric layer to be used as the mold layer 300, the intrinsic wet etch rate of the dielectric layer is varied by changing the deposition temperature. As the deposition temperature increases, the deposition rate of silicon oxide comprising the dielectric layer decreases, but the intrinsic wet etch rate of the dielectric layer decreases. Therefore, during an etching process for etching the mold layer 300 to form the through hole 350, it is possible to prevent the etch rate of the mold layer 300 from being gradually hindered by depositing the dielectric layer at a relatively low deposition temperature at first and then gradually or continuously increasing the deposition temperature. As a result, the sidewall profile of the through hole 350 can be substantially perpendicular, or the bottom CD of the through hole 350 can be slightly greater than the top CD of the through hole 350.

Referring to FIG. 11, when depositing a dielectric layer to be used as the mold layer 300, the intrinsic wet etch rate of the dielectric layer is varied depending on the changes in a ratio between reaction gases used to form the dielectric layer. In FIG. 11, the Gas Ratio legend indicates a flow rate ratio between reaction gases, specifically, the flow rate ratio of a silicon source to an oxidation source. For example, when $SiH_4$ gas is used as a silicon source and $N_2O$ gas is used as an oxidation source, the flow rate ratio between reaction gases indicates the flow rate ratio of $SiH_4$ gas to $N_2O$ gas. As the $SiH_4/N_2O$ flow rate ratio increases, that is, as the flow rate of $SiH_4$ gas increases relative to the $N_2O$ gas, the deposition rate of silicon oxide comprising the mold layer 300 increases and the intrinsic wet etch rate of the mold layer 300 also increases.

Therefore, during an etching process for etching the mold layer 300 to form the through hole 350, it is possible to prevent the etch rate of the mold layer 300 from being gradually hindered by depositing the dielectric layer with a relatively high $SiH_4/N_2O$ flow rate ratio at first, and then gradually or continuously decreasing the $SiH_4/N_2O$ flow rate ratio. As a result, the sidewall profile of the through hole 350 can be substantially perpendicular, or the bottom CD of the through hole 350 can be slightly greater than the top CD of the through hole 350.

Referring to FIG. 12, when depositing a dielectric layer to be used as the mold layer 300, the intrinsic wet etch rate of the dielectric layer is varied by changing the chamber pressure. As the pressure of the deposition chamber increases, the intrinsic wet etch rate of silicon oxide comprising the dielectric layer, i.e., the mold layer 300, increases. Therefore, during an etching process for etching the mold layer 300 to form the through hole 350, it is possible to prevent the etch rate of the mold layer 300 from being gradually hindered by depositing the dielectric layer at a relatively high chamber pressure at first, and then gradually or continuously decreasing the chamber pressure. As a result, the sidewall profile of the through hole 350 can be substantially perpendicular, or the bottom CD of the through hole 350 can be slightly greater than the top CD of the through hole 350.

Referring to FIG. 13, when depositing a dielectric layer to be used as the mold layer 300, the intrinsic wet etch rate of the dielectric layer, that is, the mold layer 300, is varied by changing a gap between the shower head 6300 and the susceptor 6200 in the PE-CVD apparatus shown in FIG. 6, in effect, by changing the gap between the shower head 6300 and a semiconductor substrate. As the spacing gap between the shower head 6300 and the susceptor 6200 increases, the intrinsic wet etch rate of silicon oxide comprising the dielectric layer, that is, the mold layer 300, increases and finally converges on a certain value. Therefore, during an etching process for etching the mold layer 300 to form the through hole 350, it is possible to prevent the etch rate of the mold layer 300 from being gradually hindered by depositing the dielectric layer with a relatively wide gap between the shower head 6300 and the susceptor 6200 of FIG. 6 at first, and then gradually or continuously narrowing the spacing gap between the shower head 6300 and the susceptor 6200. As a result, the sidewall profile of the through hole 350 can be substantially perpendicular, or the bottom CD of the through hole 350 can be slightly greater than the top CD of the through hole 350.

The experimental results illustrated in FIGS. 9 through 13 demonstrate that the mold layer 300 can be formed by gradually or continuously increasing or decreasing any of the plasma power, the deposition temperature, the ratio between reaction gases, the deposition pressure, or the spacing gap between the shower head and susceptor of the deposition apparatus, thereby making the intrinsic etch rate of the mold layer 300 gradually or continuously increase along the depth or thickness direction of the mold layer 300, ranging from the top of the mold layer 300 to the bottom of the mold layer 300.

Referring back to FIG. 8, the mold 300' used to form a three-dimensional storage node of a capacitor is formed by selectively etching the mold layer 300 through dry (anisotropic) or wet etching, preferably wet etching, to form the through hole 350 exposing the contact 270 under the mold layer 300. In forming the mold 300', it is possible to compensate for, or prevent the decreasing etch rate of the mold layer 300 as the etching process for etching the mold layer 300 to form the through hole 350 progresses. As the etching process progresses, the etch rate of the mold layer 300 can be prevented from decreasing due to polymers or the by-products of the etching process. In addition, as the etching process progresses, the etch rate of the mold layer 300 increases so that the bottom CD of the through hole 350 is about equal to or greater than the top CD of the through hole 350, leaving the sidewalls of the through hole 350 with a substantially perpendicular profile. It is understood that substantially perpendicular in the context of the present invention comprises sidewalls with a slight incline, but not as inclined as those in the prior art. The etching process for etching the mold layer 300 to form the through hole 350 finishes at the surface of the etching stopper 250 under the mold layer 300.

Figure 14:
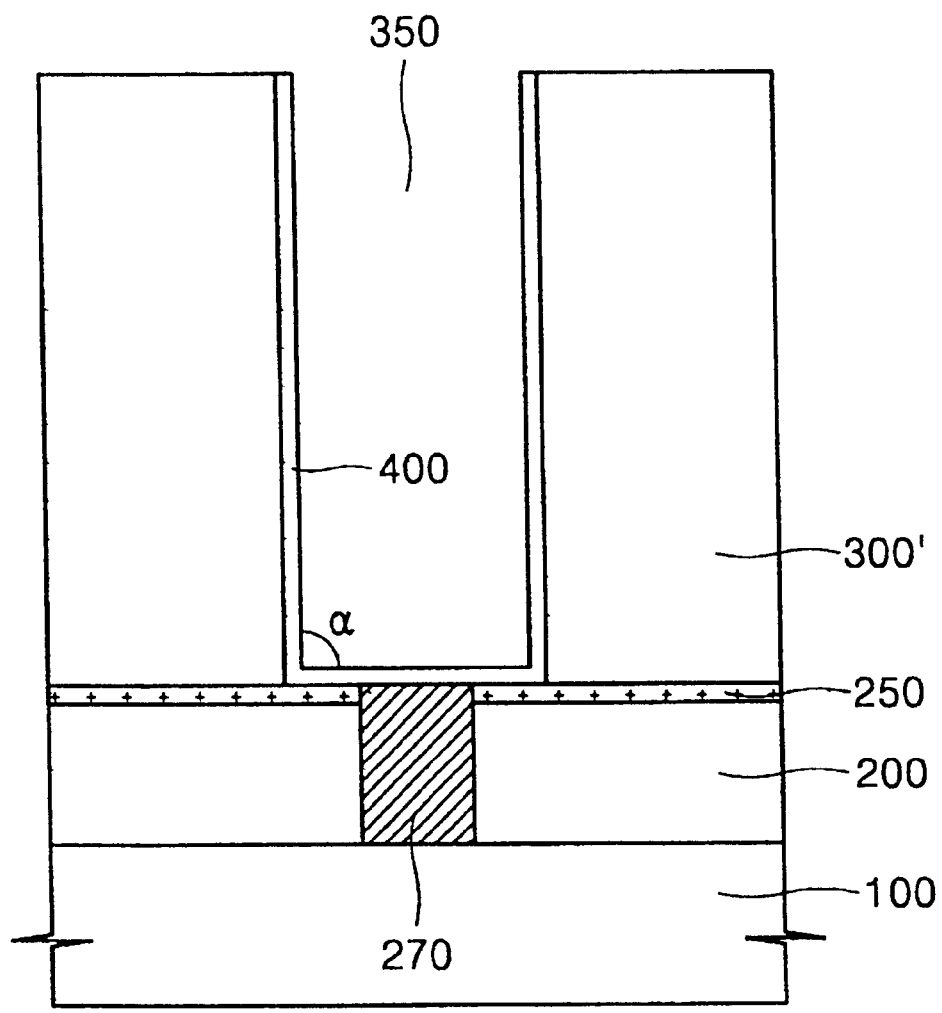
FIG. 14 is a cross-sectional view illustrating a step of forming a storage node according to an embodiment of the present invention.

FIG. 14 is a cross-sectional view illustrating a step of forming a storage node 400 on the mold 300'. Specifically, a conductive material, such as conductive polycrystalline silicon, is deposited on the mold 300' including the through hole 350, thereby forming a storage node layer along the profile of the sidewalls and bottom of the through hole 350. The storage node layer is electrically connected to the contact 270. The storage node layer is then etched back or polished (using chemical mechanical polishing (CMP)) so as to expose the upper surface of the mold layer 300, thereby forming the storage node 400 into a three-dimensional shape. In FIG. 14, a cylinder-shaped storage node 400 is illustrated, however, it is understood that within the context of the present invention, the storage node 400 may be formed into a stack, trench, concave, or other shape as well.

The angle α between the sidewall of the storage node 400 and the bottom of the storage node 400 may be substantially a right angle. As described above, the storage node 400 is formed through the introduction of the mold layer 300 having an intrinsic etch rate varying along the thickness direction of the mold layer 300 such that the sidewall of the storage node 400 makes substantially a right angle α with the bottom of the storage node 400.

Figure 15:
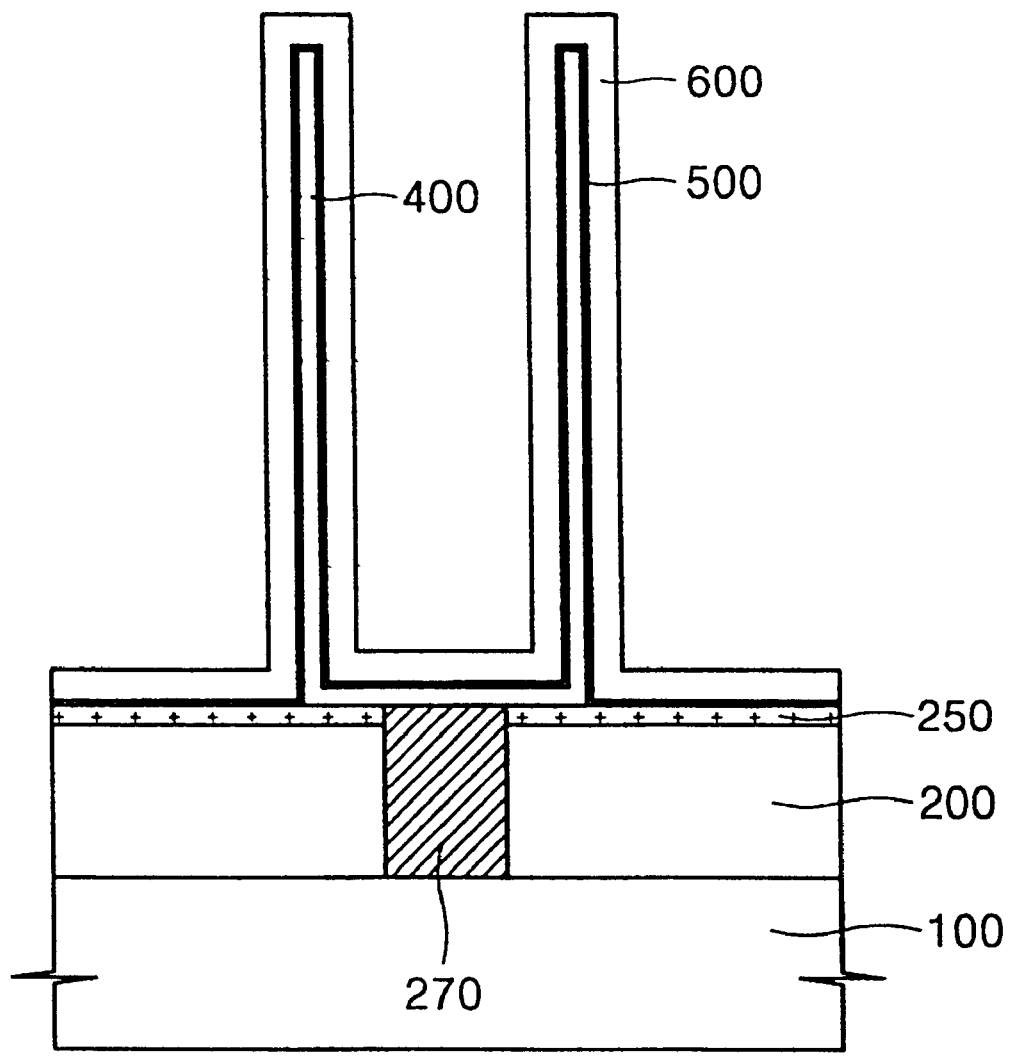
FIG. 15 is a cross-sectional view illustrating a step of forming a dielectric layer or a plate node on a storage node according to an embodiment of the present invention.

FIG. 15 is a cross-sectional view illustrating a step of forming a dielectric layer 500 and a plate node 600 on the storage node 400. Specifically, the remaining mold 300' is selectively removed using the storage node 400 as a mask. Since the mold 300' is formed of silicon oxide, the remaining mold 300' may be removed by wet etching using a known oxide etchant. After forming the cylinder-shaped storage node 400, the dielectric layer 500 and the plate node 600 are formed on the storage node 400 using conventional techniques, thereby completing a capacitor. Here, various dielectric materials may be used for the dielectric layer 500, such as tantalum oxide ($Ta_2O_5$), and titanium nitride TiN or polycrystalline silicon may be used for the plate node 600.

Figure 16:
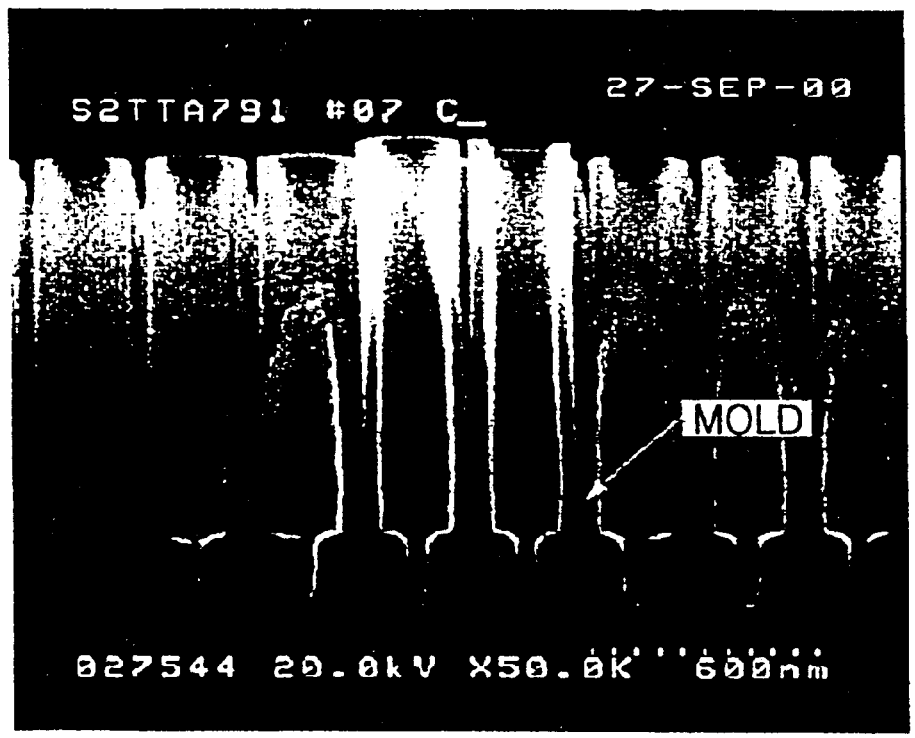
FIG. 16 is a vertical SEM image illustrating the beneficial effects of a storage node produced by a method of the present invention.

FIG. 16 is a vertical SEM image of the cross-section of a mold formed by the embodiment of the present invention which illustrates the beneficial effects of the embodiment of the present invention. As shown in FIG. 16, the sidewall of the mold is substantially perpendicular.

According to the present invention, it is possible to selectively pattern a mold layer to ensure the sidewall of a through hole is substantially perpendicular and is prevented from being inclined. Accordingly, it is possible to prevent the top CD of the through hole from being greater than the bottom CD of the through hole, and also prevent the outer sidewall of a storage node formed in the through hole from being inclined. As a result, it is possible to maximize an increase in the effective surface area of a capacitor by (i) increasing the height of the three-dimensional storage node, and (ii) preventing the step coverage of a dielectric layer or a plate node deposited on the bottom of a space between adjacent storage nodes from being deteriorated. Moreover, it is possible to obtain a storage node having a sufficient CD, thereby obtaining proper misalignment margins between the storage node and a buried contact under the storage node. It is further possible to increase the contact area between the lower portion of the storage node and the buried contact, thereby decreasing the resistance.

The present invention has been described in the context of a semiconductor device manufacturing process for forming a three-dimensional storage node as an example. However, the method for selectively etching a dielectric layer whose etch rate varies along the thickness direction of the dielectric layer, as provided by the present invention, can be applied to the manufacture of connecting wiring layers or connecting semiconductor devices and wiring layers, such as metal contacts. Thus, it will be understood by those skilled in the art that various changes in form and details may be made therein without departing from the spirit and scope of the invention as defined by the appended claims.

What is claimed is:

1. A method for manufacturing a semiconductor device, comprising:

forming a conductive contact in an upper surface of a lower dielectric layer, wherein an opposite lower surface of the lower dielectric layer confronts a surface of a semiconductor substrate;

depositing a dielectric mold layer over the lower dielectric layer and the conductive contact while modifying one of a plurality of deposition parameters such that the dielectric mold layer has an intrinsic etch rate that increases along a depth direction of a thickness of the dielectric mold layer, wherein the depth direction extends from an upper surface of the dielectric mold layer to a lower surface of the dielectric mold layer, and wherein the lower surface of the dielectric mold layer confronts the upper surface of the lower dielectric layer;

selectively etching the dielectric mold layer to form a through hole which extends through the dielectric mold layer, wherein side surfaces of the through hole are defined by the dielectric mold layer, and wherein a bottom surface of the through hole is defined by the conductive contact and upper surface portions of the lower dielectric layer; and forming a conductive layer on the side surfaces and bottom surface of the through hole to form a substantially cylindrical electrode.

2. The method of claim 1, further comprising removing the dielectric mold layer to exposed the cylindrical electrode, depositing an upper dielectric layer over the cylindrical electrode, and depositing an upper electrode over the upper dielectric layer.

3. The method of claim 2, wherein during the selectively etching, the intrinsic etch rate at a lowermost portion of the dielectric mold layer is 1.1 to 10 times greater than the intrinsic etch rate of an uppermost portion of the dielectric mold layer.

4. The method of claim 3, wherein the dielectric mold layer is formed of silicon oxide and is deposited by chemical vapor deposition.

* * * * *